United States Patent [19]

Itoh

[11] Patent Number: 5,526,308
[45] Date of Patent: Jun. 11, 1996

[54] NONVOLATILE SEMICONDUCTOR MEMORY DEVICE

[75] Inventor: Nobuhiko Itoh, Tenri, Japan

[73] Assignee: Sharp Kabushiki Kaisha, Osaka, Japan

[21] Appl. No.: 371,008

[22] Filed: Jan. 10, 1995

[30] Foreign Application Priority Data

Mar. 28, 1994 [JP] Japan .................................. 6-057157

[51] Int. Cl.⁶ ............................................ G11C 13/00
[52] U.S. Cl. .................... 365/185.18; 365/221; 365/233; 365/185.12; 365/185.03
[58] Field of Search ................................ 365/185, 221, 365/233, 185.05, 189.12, 230.03

[56] References Cited

U.S. PATENT DOCUMENTS 5,452,250  9/1995  Riggio .................................. 365/233

FOREIGN PATENT DOCUMENTS 5-86675  12/1993  Japan .

*Primary Examiner*—Terrell W. Fears
*Attorney, Agent, or Firm*—Morrison and Foerster

[57] ABSTRACT

Disclosed is a nonvolatile semiconductor memory device, including a semiconductor substrate; an insulation layer located on the semiconductor substrate; and a plurality of memory cells arranged on the semiconductor substrate in a matrix with the insulation layer therebetween. The memory cells each includes a floating gate located on the semiconductor substrate with the insulation layer therebetween, a control gate for forming a capacitance with the floating gate with the insulation layer interposed therebetween, an impurity diffusion region located in the semiconductor substrate and having an opposite conductivity to that of the semiconductor substrate, and a bit line connected to the impurity diffusion region. The nonvolatile semiconductor memory device further includes an application device for applying a control voltage for reading data from the memory cell to the control gate; and a determination device for determining data to be read from a plurality of sets of data and outputting the data. The determination device determines the data to be read, based on the difference in voltages on the bit line in two different states of the memory cell. The difference in the voltages on the bit line is caused by the difference in the capacitances between the floating gate and the semiconductor substrate in the two different states of the memory cell. The difference in the capacitances is caused by the difference in charge levels in the floating gate when the control voltage is applied to the control gate in the two different states of the memory cell.

10 Claims, 9 Drawing Sheets

NONVOLATILE SEMICONDUCTOR MEMORY DEVICE

BACKGROUND OF THE INVENTION

1. Field of the Invention

The present invention relates to a nonvolatile semiconductor memory device, and in particular to a nonvolatile semiconductor memory device provided with a floating gate for storing data based on the state of a charge accumulated in the floating gate.

2. Description of the Related Art

Briefly referring to FIG. 16, a conventional nonvolatile semiconductor memory device of the above-mentioned type will be described. In FIG. 16, symbol SA denotes a sensing amplifier, YD denotes a decoder in a y direction, MC denotes a nonvolatile memory cell, WL1 through WLn denote word lines, BL1 through BLm denote bit lines, and SO denotes a source line for a plurality of nonvolatile memory cell sections including two memory cells MC. The word lines WL1 through WLn are selected by a decoder in an x direction (not shown) perpendicular to the y direction.

FIG. 17 is a circuit diagram of an example of the sensing amplifier SA. An input IN receives the potential of a bit line BLi (i=1, 2, . . . , m) which is selected from the bit lines BL1 through BLm. Symbol $V_{REF}$ is a prescribed reference potential. Symbol SS denotes a control signal. While the signal SS is low, precharging is performed; and while the signal SS is high, sensing is performed to output a signal DOUT representing memory data.

In such a nonvolatile semiconductor memory device, data is read using the phenomenon that the threshold voltage of a transistor provided in the nonvolatile memory cell changes in accordance with the level of the charge accumulated in a floating gate. In more detail, the voltage on the bit line BL is set to an arbitrary voltage level while the source line SO is grounded. When the voltage level of the word line WL is raised, the charge accumulated in the bit line BL flows out to the source side of the transistor and thus decreases. The threshold voltage of the transistor is determined based on the reduction level in the charge. Thus, data "1" or "0" is read out.

In the above-described circuit, the source line of the transistor should be grounded for reading data. This process requires the transistor to have a source diffusion region and a contact area for supplying a potential to the source diffusion region in a memory cell array. This enlarges the area of the nonvolatile memory device. Further, if the memory cell is in an excessive erase state, the threshold voltage of the transistor becomes negative, and thus a transistor in a memory cell connected to an unselected word line is turned on when the bit line BL is precharged to a prescribed level before the reading operation. Accordingly, it may be impossible to precharge the bit line BL properly, or wrong data may possibly be read since the transistor of the memory cell connected to an unselected word line is "ON" although the transistor of the memory cell connected to a selected word line is "OFF".

The above-mentioned problem will be described in more detail with reference to FIG. 16. An operation by which electrons are injected into a floating gate FG is referred to as to a "program operation". By contrast, an operation by which electrons accumulated in the floating gate FG are discharged is referred as to an "erase operation". In the erase operation, it is difficult to control the amount of discharge to be equal to the amount of the accumulated electrons. If the amount of discharge is larger than the amount of the accumulated electrons, holes are generated in the floating gate FG. As the result, the threshold voltage of the transistor of the memory cell MC becomes negative. This state of the memory cell MC is referred to as the "excessive erase state". As an example, the case where the threshold voltages of memory cells A and B in FIG. 16 are normally 5 V and 0.5 V, respectively, and the excessive erasure occurs to the memory cell B which results in the threshold voltage of the memory cell B becoming −1 V, is described. Even if the voltage on the WL2, which is connected to a control gate CG of the transistor in the memory cell B is 0 V, the source S and the drain D of the transistor in the memory cell B is electrically connected. That is, the transistor of the memory cell B is in an ON-state even if the memory cell B is in an unselected state. As the result, the level of the voltage applied to BL1 for reading date in the memory cell A is affected by a current through the memory cell B. Accordingly, the data stored in the memory cell A cannot be read correctly.

In order to solve such problems, circuits shown in Japanese Patent Publication No. 5-86675 (Japanese Laid-Open Patent Publication No. 59-147461) have been proposed. In a circuit shown in FIG. 2 of the above publication, when data is read out, the data is changed by carriers, such as hot electrons, which are generated in a floating gate by zener or avalanche breakdown. Accordingly, refreshing of the data is necessary despite the use of the circuit in a nonvolatile memory device. In a circuit shown in FIG. 4 of the above-described publication, a bit line also acts as a control gate, and thus two or more memory cells cannot be arranged on one bit line. In such a structure, data cannot be decoded in the direction of the control gate as is conventionally done, and therefore the memory cell arrays cannot be highly integrated.

SUMMARY OF THE INVENTION

A nonvolatile semiconductor memory device according to the present invention includes a semiconductor substrate; an insulation layer located on the semiconductor substrate; a plurality of memory cells arranged on the semiconductor substrate in a matrix with the insulation layer therebetween, the memory cells each including a floating gate located on the semiconductor substrate with the insulation layer therebetween, a control gate for forming a capacitance with the floating gate with the insulation layer interposed therebetween, an impurity diffusion region located in the semiconductor substrate and having an opposite conductivity to that of the semiconductor substrate, and a bit line connected to the impurity diffusion region; an application member for applying a control voltage for reading data from the memory cell to the control gate; and a determination member for determining data to be read from a plurality of sets of data and outputting the data. The determination member determines the data to be read, based on the difference in voltages on the bit line which is caused by the difference in the capacitances between the floating gate and the semiconductor substrate. The difference in the capacitances is caused by the difference in charge levels in the floating gate when the control voltage is applied to the control gate.

Thus, the invention described herein makes possible the advantage of providing a nonvolatile semiconductor memory device which requires no source diffusion region nor does it change data written in a memory cell during data reading.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
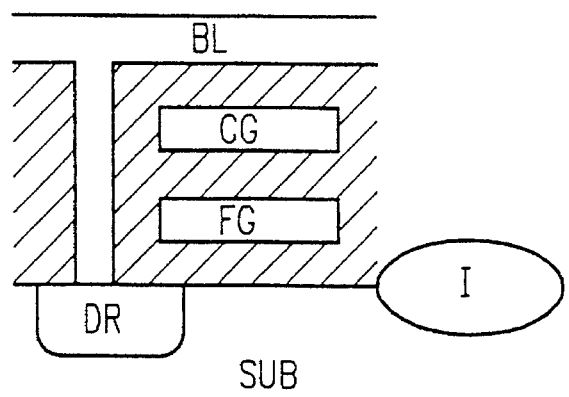
FIG. 1 is a cross sectional view of a memory cell of a nonvolatile semiconductor memory device according to the present invention in a program state.
Figure 2:
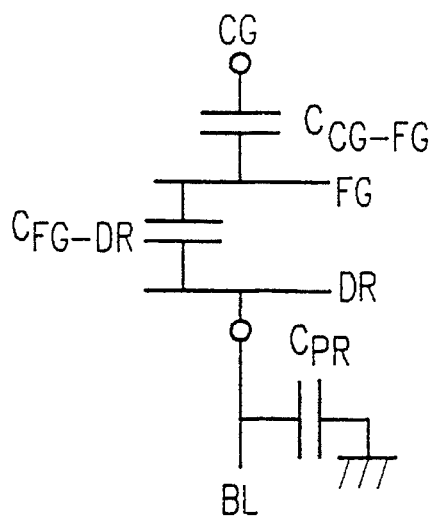
FIG. 2 is an equivalent circuit of the memory cell of the nonvolatile semiconductor memory device shown in FIG. 1 in the program state.
Figure 3:
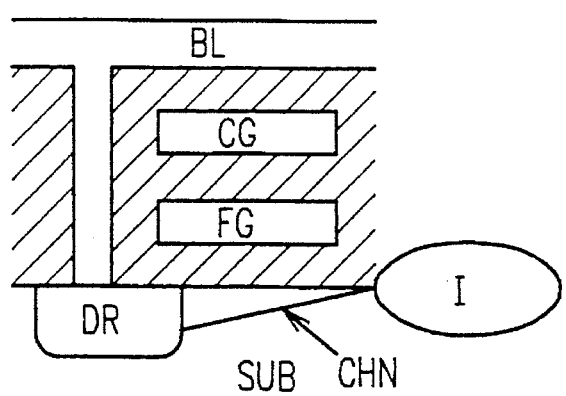
FIG. 3 is a cross sectional view of the memory cell of the nonvolatile semiconductor memory device shown in FIG. 1 in an erase state.
Figure 4:
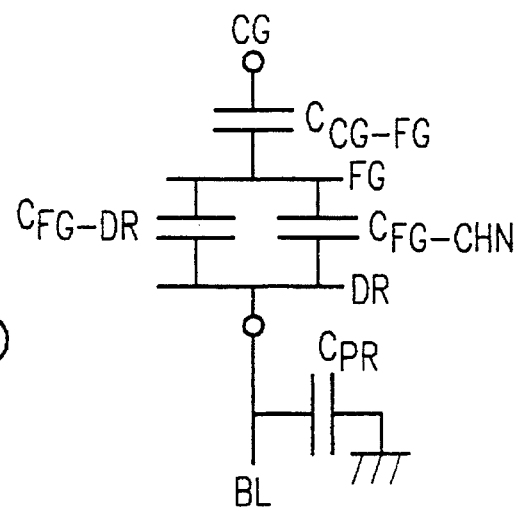
FIG. 4 is an equivalent circuit of the memory cell of the nonvolatile semiconductor memory device shown in FIG. 1 in the erase state.
Figure 5:
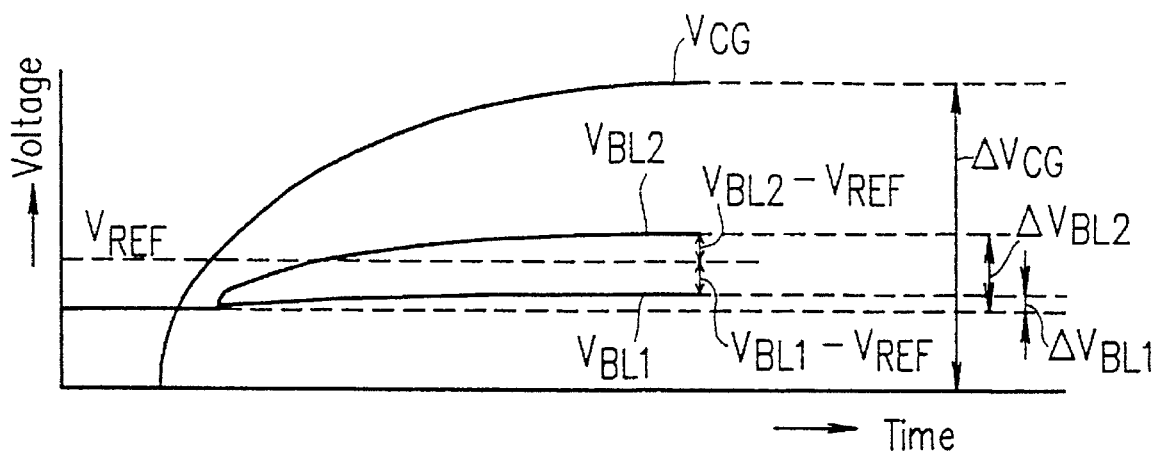
FIG. 5 is a graph illustrating voltages at a control gate and a bit line over time during the data reading operation of the nonvolatile semiconductor memory device shown in FIG. 1.

Referring to FIGS. 1 through 5, the principle of the present invention will be described. FIG. 1 is a cross sectional view of a memory cell of a nonvolatile semiconductor memory device according to the present invention in a program state. FIG. 2 is an equivalent circuit of the memory cell in the program state. FIG. 3 is a cross sectional view of the memory cell of the nonvolatile semiconductor memory device in an erase state. FIG. 4 is an equivalent circuit of the memory cell in the erase state. FIG. 5 is a graph illustrating voltages at a control gate and a bit line over time during the data reading operation.

In FIGS. 1 and 3, symbol BL denotes a bit line, CG denotes a control gate (word line), FG denotes a floating gate, DR denotes an n-type drain diffusion region, I denotes an isolation area formed of, for example, $SiO_2$, SUB denotes a p-type substrate formed of silicon, and the hatched area is an insulation layer. CHN in FIG. 3 denotes a conductive channel formed in a channel region. In FIGS. 2 and 4, symbol $C_{CG-FG}$ denotes a capacitance between the control gate CG and floating gate FG, $C_{FG-DR}$ denotes a capacitance between the floating gate FG and the drain diffusion region DR, $CF_{FG-CHN}$ denotes a capacitance between the floating gate FG and the conductive channel CHN and $C_{PR}$ denotes a parasitic capacitance of the bit line BL.

In the case where electrons are injected into the floating gate FG of the memory cell as is shown in FIG. 1 (program state), the conductive channel CHN (inversion layer) is not generated in the channel region below the floating gate FG. As a result, the capacitance between the floating gate FG and the substrate SUB is equal to the capacitance $C_{FG-DR}$. When the voltage in the control gate CG changes by $\Delta V_{CG}$, the voltage on the bit line $V_{BL1}$ in the program state changes by $\Delta V_{BL1}$ expressed by Equation (1).

$$\Delta V_{BL1} = \Delta V_{CG}/\{1+(1/C_{CG-FG}+1/C_{FG-DR})C_{PR}\} \ldots \quad (1)$$

In the case where no electron is injected to the floating gate FG of the memory cell as is shown in FIG. 3 (erase state), a conductive channel CHN (inversion layer) is formed by excited electrons in the channel region below the floating gate FG. As a result, the capacitance between the floating gate FG and the substrate SUB is $C_{FG-DR}+C_{FG-CHN}$. When the voltage in the control gate CG changes by $\Delta_{CG}$, the voltage in the bit line $V_{BL2}$ in the erase state is changed by $\Delta V_{BL2}$ expressed by Equation (2).

$$\Delta V_{BL2} = \Delta V_{CG}/[1+\{1/C_{CG-FG}+1/(C_{FG-DR}+C_{FG-CHN})\}C_{PR}] \ldots \quad (2)$$

By comparison-amplifying the difference between $\Delta V_{BL1}$ and $\Delta V_{BL2}$ with a prescribed reference potential $V_{REF}$ which is internally determined, data "1" or "0" written in the memory can be read. The concept of such operation is shown in FIG. 5.

Figure 6:
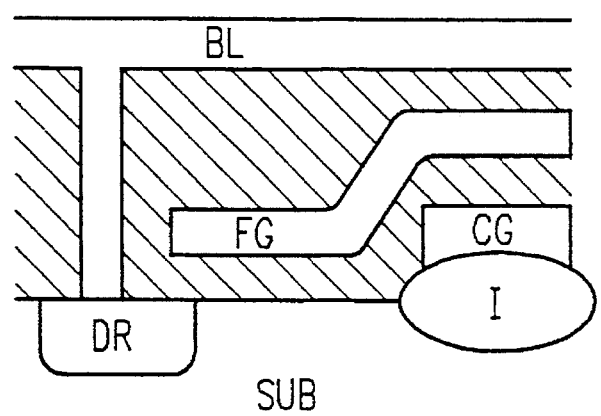
FIG. 6 is a cross sectional view of a nonvolatile semiconductor memory device according to the present invention having a different structure from that of the device shown in FIG. 1.

The control gate CG and the floating gate FG are not necessarily arranged as is shown in FIGS. 1 and 3. For example, as is shown in FIG. 6, it is possible to provide the control gate CG on the isolation region and the floating gate FG so as to cover the control gate CG and partially cover the drain diffusion region DR with an insulation layer interposed therebetween. In the arrangement shown in FIG. 6, the area of the floating gate FG can be larger than that of the floating gate FG shown in FIG. 1. This leads to wider process margin.

Hereinafter, practical examples according to the present invention will be described.

EXAMPLE 1

Figure 7:
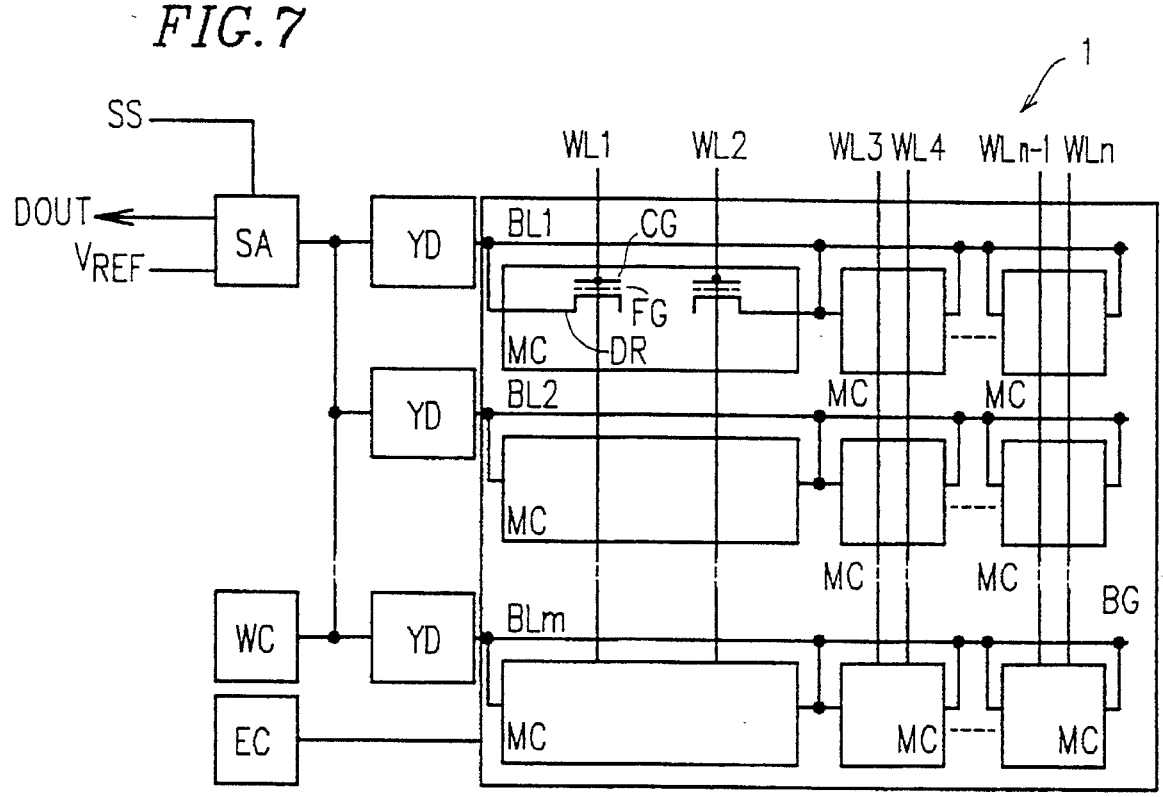
FIG. 7 is a block diagram of a nonvolatile semiconductor memory device in a first example according to the present invention.

FIG. 7 is a block diagram illustrating a structure for a nonvolatile semiconductor memory device 1 in a first example according to the present invention. As is shown in FIG. 7, the nonvolatile semiconductor memory device 1 includes a sensing amplifier SA, decoders YD in a y direction, word lines WL1 through WLn, bit lines BL1 through BLm, nonvolatile memory cells MC, a writing circuit WC, an erasing circuit EC, and a backgate BG. The word lines WL are selected by a decoder in an x direction (not shown for simplicity).

Figure 8:
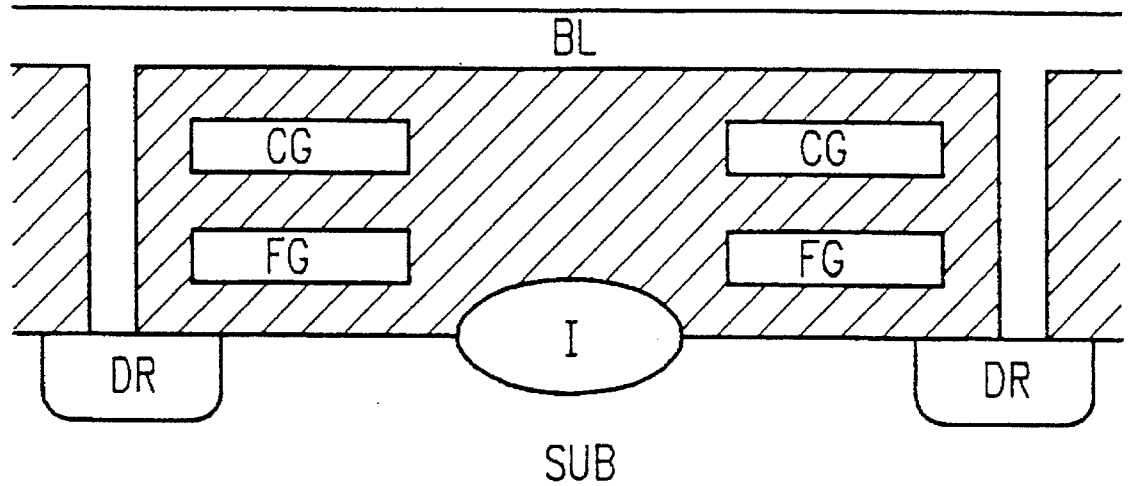
FIG. 8 is an enlarged cross sectional view of a memory cell of the nonvolatile semiconductor memory device shown in FIG. 7.

FIG. 8 is a view illustrating the structure of a memory cell section each including two memory cells MC. As is shown in FIG. 8, each memory cell MC includes a control gate CG connected to the corresponding word line WL (FIG. 7) and a drain diffusion region DR connected to the corresponding bit line BL. Each memory cell MC may include a source diffusion region which is not connected to any line although the source diffusion region need not be formed in the memory cell MC.

Figure 17:
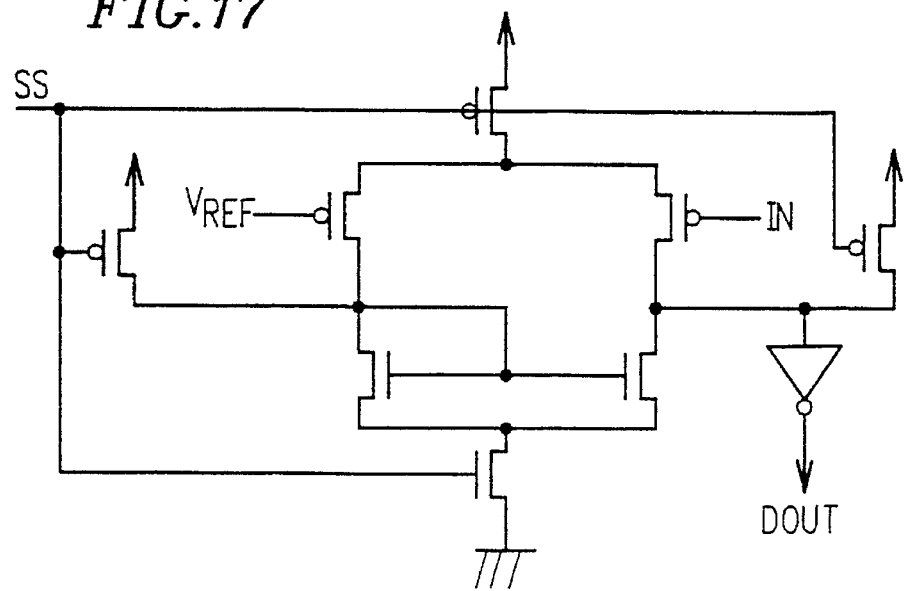
FIG. 17 is a circuit diagram of a sensing amplifier in the conventional nonvolatile semiconductor memory device shown in FIG. 16.

The sensing amplifier SA has the same structure as is shown in FIG. 17.

In the case where a great number of electrons are accumulated in the floating gate FG in the memory cell MC as is shown in FIG. 1 (program state), during the time the control gate CG is in the off state, the conductive channel CHN (inversion layer) is not formed in the channel region. This is because holes are excited in the channel region. Accordingly, the capacitance between the floating gate FG and the substrate SUB is $C_{FG-DR}$ as is shown in FIG. 2. As a result, the voltage $V_{BL1}$ on the bit line BL in the program state increases by $\Delta V_{BL1}$ expressed by Equation (1) in accordance with an increase in the voltage by $\Delta V_{CG}$ in the word line WL connected to the control gate CG, as is illustrated in FIG. 5.

By contrast, in the case where no electrons are accumulated in the floating gate FG as is shown in FIG. 3 (erase state), during the time the control gate CG is in the off state, the conductive channel CHN (inversion layer) is formed in the channel region. This is because electrons are excited in the channel region. Accordingly, the capacitance between the floating gate FG and the substrate SUB is $C_{FG-DR}+C_{FG-CHN}$. As a result, the voltage $V_{BL2}$ on the bit line BL in the erased state increases by $\Delta V_{BL2}$ as is expressed by Equation (2) in accordance with an increase in the voltage by $\Delta V_{CG}$ in the word line WL connected to the control gate CG, as is illustrated in FIG. 5.

Accordingly, the voltage in the bit line BL increases in accordance with an increase in the voltage in the control gate CG by a larger level in the erase state ($V_{BL2}$) than in the program state ($V_{BL1}$). Utilizing such a phenomenon, by setting a reference potential $V_{REF}$ of the sensing amplifier SA to be midway between the potential in the program state and the potential in the erase state by resistance division or the like and comparison-amplifying the voltage in the bit line BL and the reference potential $V_{REF}$, data written in the memory cell MC can be read. It may also be possible to read the data in the memory cell by detecting $\Delta V_{BL1}$ and $\Delta V_{BL2}$.

Figure 9:
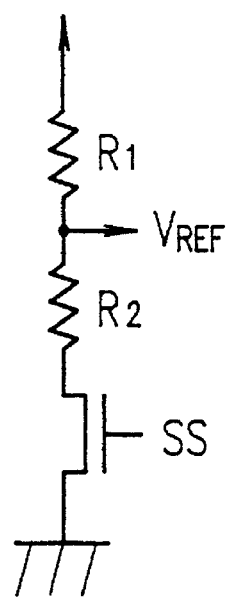
FIG. 9 is a diagram of a circuit for setting a reference potential in the nonvolatile semiconductor memory device shown in FIG. 7.

FIG. 9 is a diagram of a circuit for setting the reference potential $V_{REF}$. Values of resistances $R_1$ and $R_2$ are set so as to allow the value of $V_{REF}$ to be the same as described above.

In the nonvolatile semiconductor memory device 1 in this example, since the potential at the drain diffusion region DR is up to approximately 1 V, carrier generation caused by the zener or avalanche breakdown as occurs in the case of Japanese Patent Publication No. 5-86675 does not occur. Accordingly, written data does not change.

The lowest possible voltage to be applied to the control gate CG for data reading is determined by the sensitivity of the sensing amplifier SA. The highest possible voltage is determined by a withstand voltage of the insulating layer below the control gate CG and the floating gate FG. An optimum voltage in the range between the highest and the lowest voltages is applied to the control gate CG. The capacitances $C_{CG-FG}$ and $C_{FG-DR}$ can be controlled by the thickness of the respective insulating layer and the area of the respective gate electrode.

Data programming in a memory cell MC is performed by setting the voltage on the word line WL to be higher than the voltage on the bit line BL. For example, data is programmed in a selected memory cell in the following manner utilizing hot electrons. A voltage equal to or higher than a supply voltage is applied to the bit line BL which is decoded by the decoder YD, in the state where the voltage on the word line WL is at least twice of the supply voltage and the writing circuit WC is active. The substrate SUB is grounded or supplied with a prescribed negative potential. The supply voltage is usually approximately 5 V. In general, when the supply voltage is 5 V, the voltage on the word line WL is approximately 10 to 15 V, and the voltage on the bit line BL is 5 to 8 V. Impurity implantation to the drain diffusion region DR is needed in order to rapidly change the potential in the vicinity of the interface between the drain diffusion region DR and the channel region when the voltage is applied, namely, in order to generate a strong electric field so as to facilitate the generation of the hot electrons. This method can provide a relatively fast writing speed.

Data programming in the selected memory cell MC may also be performed by injecting electrons to the floating gate FG using a tunnel current in the state where the supply voltage is 5 V, the voltage on the word line WL is approximately 21 V, and the drain voltage in the selected memory cell is 0 V. The drain voltage in unselected memory cells is approximately 10 V. This method can provide data programming with a relatively small current.

The data in the memory cell MC is electrically erased by, for example, a source erasure method, a source and gate erasure method, and a substrate erasure method. By the source erasure method, for example, a voltage of 0 V is applied to the gate, and a voltage of 12 V is applied to the source. By the source and gate erasure method, for example, a voltage of −10 V is applied to the gate, and a voltage of 5 V is applied to the source. By the substrate erasure method, for example, a voltage of −18 V is applied to the gate. If the source is not provided, the data in the memory cell MC may be erased by applying the above-mentioned voltage to the drain instead of the source. Alternatively, data erasure is performed by irradiating UV to the memory cell to excite the electrons in the floating gate FG, thereby allowing the electrons to go beyond the energy barrier of the insulation layer as in the case of an EPROM and the like.

EXAMPLE 2

Figure 10:
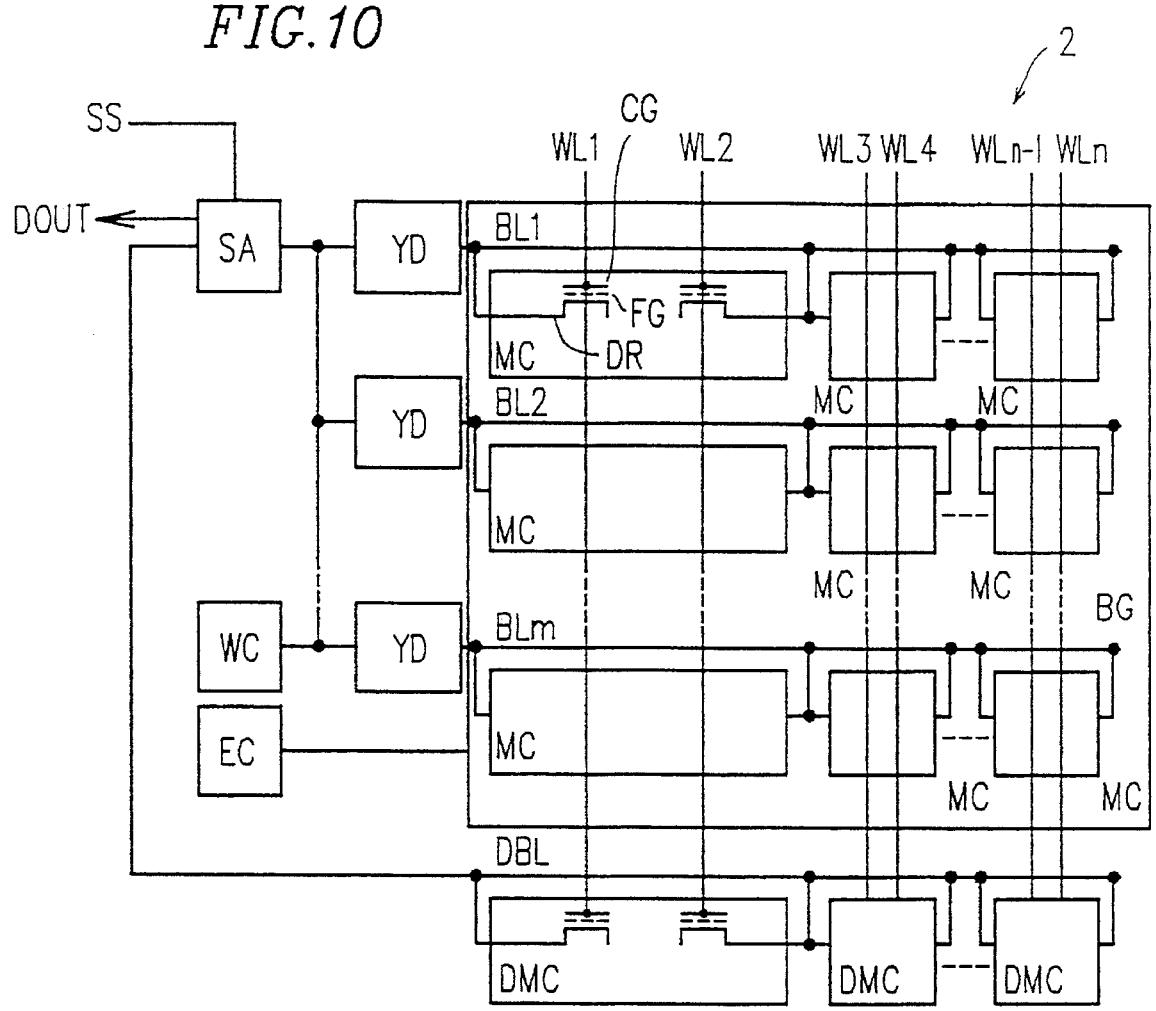
FIG. 10 is a block diagram of a nonvolatile semiconductor memory device in a second example according to the present invention.

FIG. 10 is a block diagram of a nonvolatile semiconductor memory device 2 in a second example according to the present invention. In this example, the prescribed reference potential $V_{REF}$ is set using a dummy cell. In FIG. 10, symbol DMC denotes a dummy nonvolatile memory cell, and DBL denotes a dummy bit line. The two dummy nonvolatile memory cells form a dummy memory section. The level of the charge accumulated in a floating gate FG in the dummy memory cell DMC is set to be lower than the level of the charge injected to the floating gate FG of the memory cell MC by an internal circuit. Such setting is performed in advance by using an external device such as a device tester.

Figure 11:
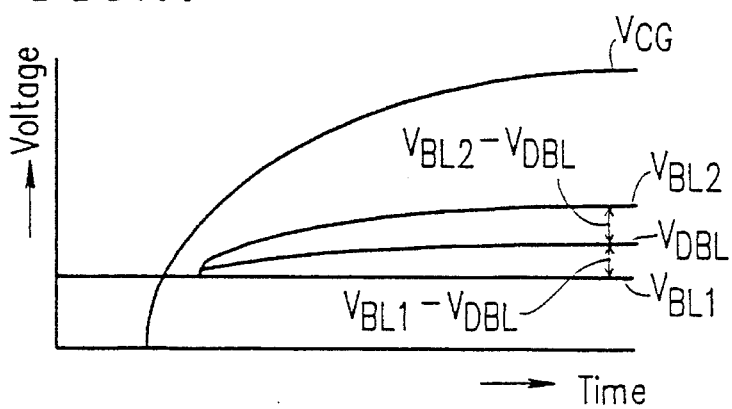
FIG. 11 is a graph illustrating voltages at a control gate and a bit line over time during the data reading operation of the nonvolatile semiconductor memory device shown in FIG. 10.

In the case where a great number of electrons are accumulated in the floating gate FG of the memory cell MC as is shown in FIG. 1 (program state), during the time the control gate CG is in the off state, a conductive channel CHN (inversion layer) is not formed in the channel region of the transistor of the memory cell MC. This is because holes are excited in the channel region. Accordingly, the capacitance between the control gate CG and the substrate SUB is $C_{FG-DR}$ as is shown in FIG. 2. As a result, the voltage $V_{BL2}$ on the bit line BL in the program state increases by $\Delta V_{BL1}$ expressed by Equation (1) in accordance with an increase in the voltage by $\Delta V_{CG}$ in the word line WL connected to the control gate CG connected. By contrast, in the case where no electrons are accumulated in the floating gate FG as is shown in FIG. 3 (erase state), during the time the control gate CG is in the off state, a conductive channel CHN (inversion layer) is formed in the channel region. This is because electrons are excited in the channel region. Accordingly, the capacitance between the floating gate FG and the substrate SUB is $C_{FG-DR}+C_{FG-CHN}$ as is shown in FIG. 4. As a result, the voltage $V_{BL2}$ on the bit line BL in the erase state increases by $\Delta V_{BL2}$ expressed by Equation (2) in accordance with an increase in the voltage by $\Delta V_{CG}$ on the word line WL connected to the control gate CG. The voltage on the bit line BL increases more in the erase state than in the program state as is appreciated from FIG. 11. The reference voltage $V_{REF}$ of the sensing amplifier SA is set to be equal to the reading voltage of the dummy memory cell DMC via the dummy bit line DBL as is illustrated in FIG. 10. The level of the reading voltage of the dummy memory cell DMC is a function of the level of the charge accumulated in the floating gate FG in the dummy memory cell DMC. As is mentioned above, the level of the charge accumulated in the floating gate FG in the dummy memory cell DMC is set to be lower than the level of the charge injected to the floating gate FG of the memory cell MC by the internal circuit. Due to such a setting, as is shown in FIG. 11, the reading voltage of the dummy memory cell DMC is midway between the voltage $V_{BL1}$ on the bit line BL in the program state and the voltage $V_{BL2}$ on the bit line BL in the erase state. By comparing the levels of the voltages $V_{DBL}$ on the dummy bit line DBL and the voltages $V_{BL1}$ and $V_{BL2}$ on the bit line BL, the data written in the memory cell MC can be read. That is, the data in the memory cell MC can be determined by the result of detecting which one of the potential on the data line ($V_{BL1}$ or $V_{BL2}$) and the reference potential ($V_{DBL}$) is higher. This comparison operation can be conducted by using a sensing amplifier SA having the same structure as is shown in FIG. 17.

In the above-described method, the reading voltage of the dummy memory cell DMC is used as a reference voltage. Accordingly, the reading margin can be larger than the reading margin obtained by the method of comparison-amplifying the prescribed reference voltage, which is constant with time, obtained by resistance division and the voltage in the bit line BL. As a result, reading can be performed at a higher speed.

As is shown in FIG. 5, when the prescribed reference voltage $V_{REF}$ obtained by resistance division or the like is used as the reference voltage for reading data, the voltage $V_{BL2}$ on the bit line BL in the erase state is lower than $V_{REF}$ as is the voltage $V_{BL1}$ in the program state in an initial stage of reading. Accordingly, in the case where data is read based on the comparison result of the levels of the reference voltage $V_{REF}$ and the voltages $V_{BL1}$ and $V_{BL2}$, the voltage $V_{BL2}$ may be incorrectly read as the voltage $V_{BL1}$ during the initial stage. By contrast, when the voltage $V_{DBL}$ on the dummy bit line DBL is used as the reference voltage, the voltage $V_{BL2}$ is higher than the reference voltage $V_{DBL}$, from the start of reading as is shown in FIG. 11. Accordingly, there is no possibility that the voltage $V_{BL2}$ is incorrectly read as the voltage $V_{BL1}$ even if the reading speed is raised. Needless to say, it is possible to comparison-amplify the difference between the voltages $V_{DBL}$ and, $V_{BL1}$ and $V_{BL2}$ and to read the data based on the difference.

Data may be programmed into and erased from the memory cell MC in the same manner as described above with reference to FIG. 7. UV irradiation should not be used because UV erases the data stored in the dummy memory cell DMC.

Figure 12:
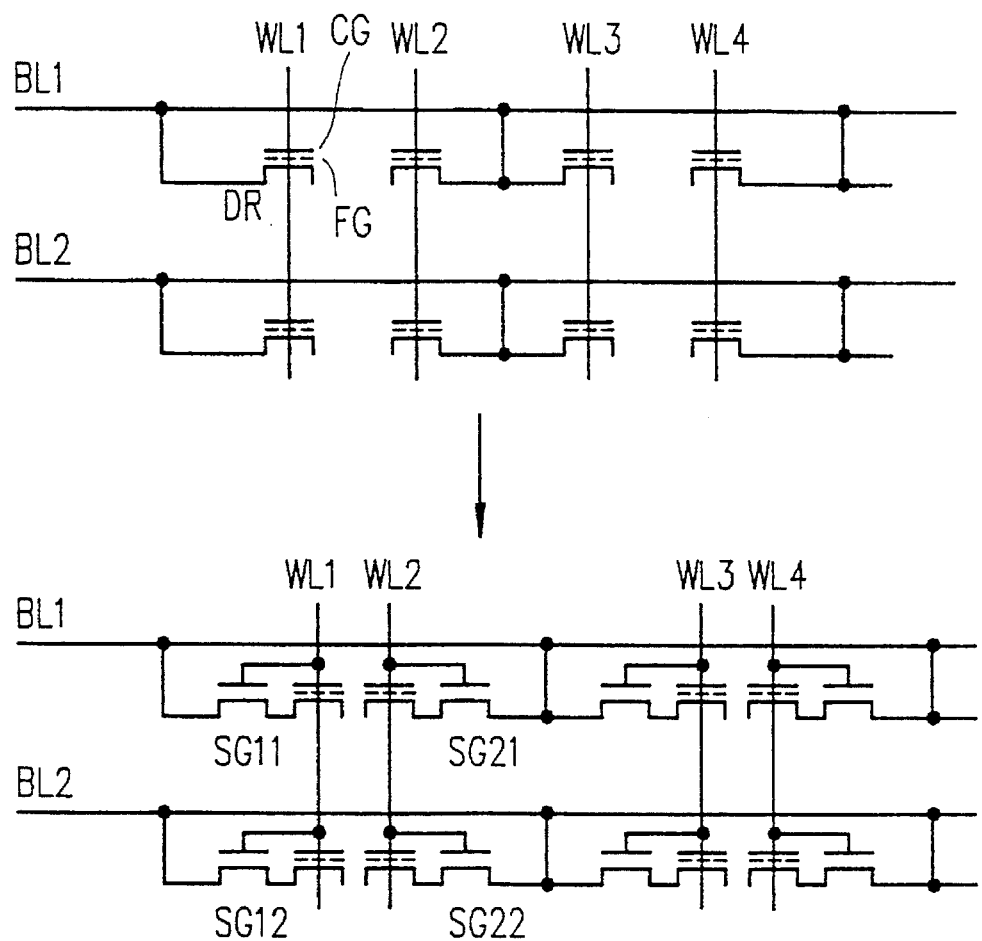
FIG. 12 is a circuit diagram of the nonvolatile semiconductor memory device in accordance with the second example and a circuit diagram of a nonvolatile semiconductor memory device provided with select gates.
Figure 13:
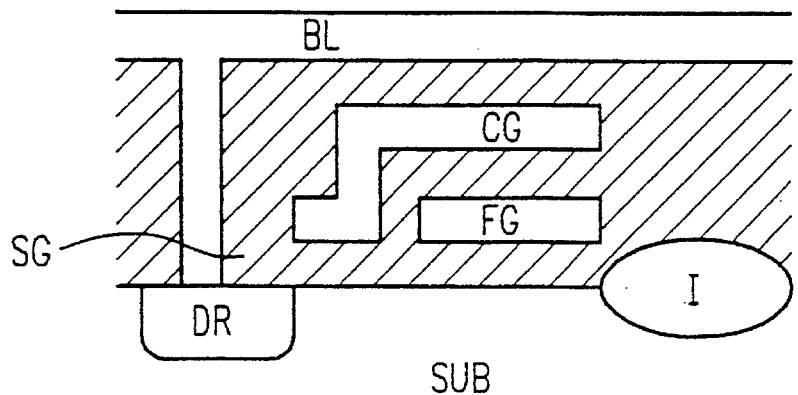
FIG. 13 is a cross sectional view of a memory cell of the nonvolatile semiconductor memory device shown in FIG. 10.

In the first and the second examples, a nonvolatile semiconductor memory having an array structure is described. In such a case, a capacitance between the drain diffusion region and the floating gate of a memory cell which shares the bit line with the selected memory cell should also be considered. Such a capacitance changes in accordance with whether the device is in the program state or in the erase state. As a result, different bit lines BL have different levels of reading voltages. Accordingly, when the number of memory cells connected to one bit line BL is increased, a select gate SG for selecting the memory cell MC is needed between the drain diffusion region and the bit line BL of each memory section as is shown in FIG. 12. FIG. 13 shows a cross sectional view of the device shown in FIG. 12. As is shown in FIG. 13, the select gate SG can share the gate with the control gate CG of the memory cell MC which is selected by the select gate SG. Thus, provision of the select gate SG does not enlarge the area of the device. The select gate SG may alternatively be provided separately from the control gate CG, in which case, the select gate SG may be formed of the same material as the floating gate FG, for example, polysilicon.

Further, the area required for one datum can be reduced by storing "polynary" data (for example, quarternary, quinary, or senary data) in each memory cell MC.

EXAMPLE 3

Figure 14:
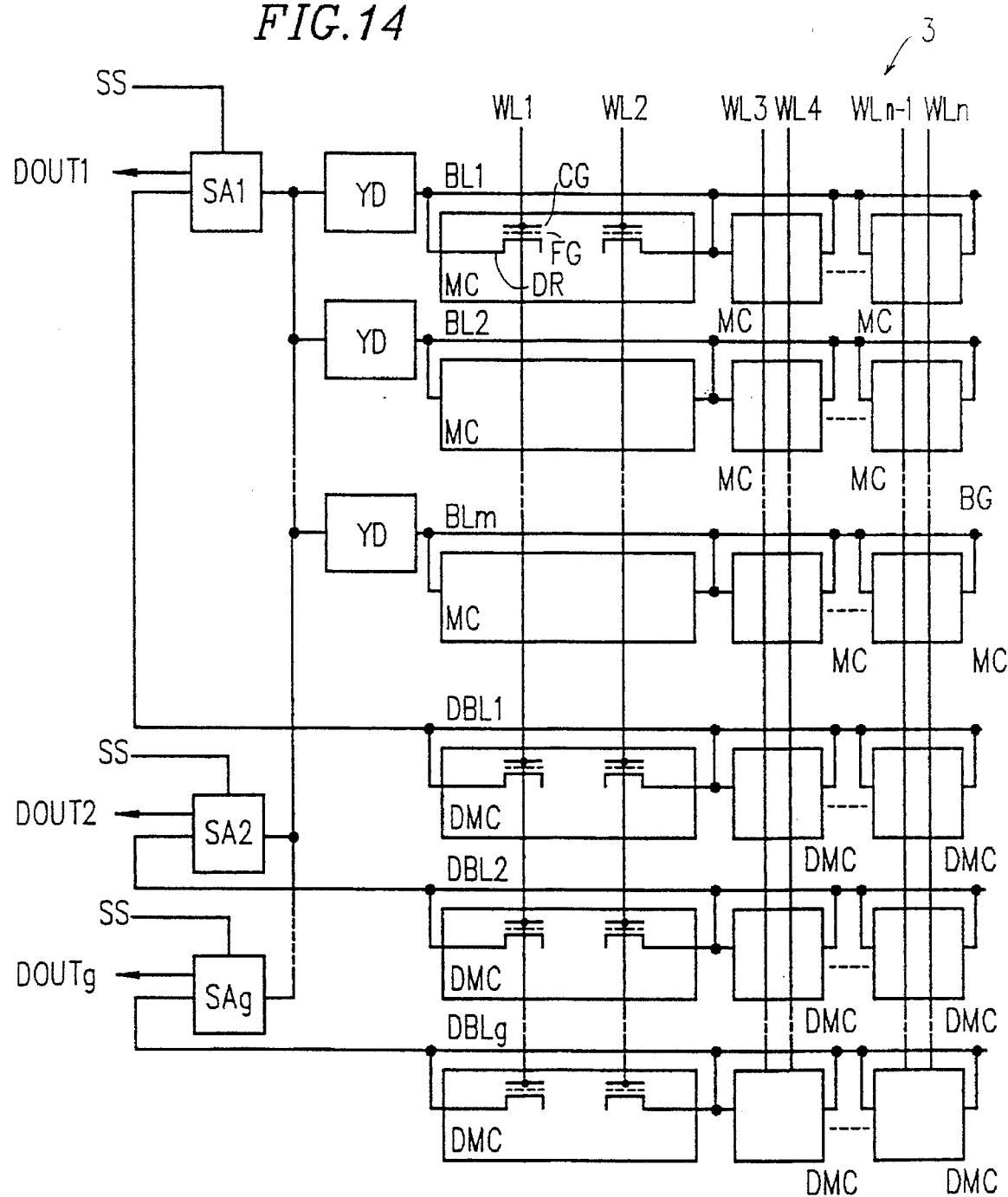
FIG. 14 is a block diagram of a nonvolatile semiconductor memory device in a third example according to the present invention.

FIG. 14 is a block diagram illustrating a structure for a nonvolatile semiconductor memory device 3 in a third example according to the present invention. As is shown in FIG. 14, the nonvolatile semiconductor memory device 3 includes sensing amplifiers SA1 through SAg, decoders YD in a y direction, memory cell sections each including two memory cells MC, word lines WL1 through WLn, bit lines BL1 through BLm, dummy bit lines DBL1 through DBLg, and dummy memory cell sections each including two dummy memory cells DMC. The word lines WL are selected by a decoder in an x direction (not shown for simplicity). A data writing circuit WC and a data erasure circuit EC are also omitted from FIG. 14. Data in the number of g+1 can be stored in one memory cell MC.

Each memory cell MC includes a control gate CG connected to the corresponding word line WL and a drain diffusion region DR connected to the corresponding bit line BL. Each dummy memory cell DMC also includes a control gate CG connected to the corresponding word line WL and a drain diffusion region DR connected to the corresponding dummy bit line DBL. Each memory cell MC and each dummy memory cell DMC may include a source diffusion region which is not connected to any line although the source diffusion region need not be included in the memory cell MC or the dummy memory cell DMC.

The dummy memory cells DMC connected to the same dummy bit line DBL are set to have an identical level of charge accumulated in the floating gates FG thereof. The dummy memory cells DMC connected to the same word line WL are set to have different amounts of electrons injected thereto in advance by using an external device such as a device tester or the like, so that different levels of reading voltages will be supplied to different dummy bit lines DBL1 through DBLg.

For example, in the case that the reading voltage of the dummy cells DMC supplied to dummy bit lines DBL are $V_{DBL1} < V_{DBL2} < \ldots < V_{DBLg} < V_{ER}$ (the voltage in the erase state) for reading data of the memory cell MC, the voltage in the erase state ($V_{ER}$) is higher than the voltage supplied to any dummy bit line DBL. As a result, all the outputs DOUT1 through DOUTg from all the sensing amplifiers SA1 through SAg are "1". In the case when data are programmed in the memory cells MC so that $V_{DB1} < V_{BL} < V_{DBL2}$ may be realized, only the output DOUT1 from the sensing amplifier SA1 is "1" and the other outputs are all "0". The data stored in the memory cell MC is read in the form of the number of the "1" data supplied from the corresponding sensing amplifier SA in accordance with the level of the reading voltage. Thus, polynary data can be read. That is, the polynary data is read based on the result of detecting whether each reference potential ($V_{DBL1}-V_{DBLg}$) is higher than the potential on the bit line ($V_{BL}$) which corresponds to charge accumulated on the floating gate FG in the memory cell MC. By providing an encoder or the like for receiving the outputs DOUT1 through DOUTg, binary codes having a prescribed number of bits (for example, a 2-bit binary code for quarternary data) can be obtained.

Data may be programmed into and erased from the memory cell MC in the same manner as described above with reference to FIG. 7. UV irradiation should not be used because UV erases the data stored in the dummy memory cell DMC. For dealing with polynary data, a select gate SG is preferably provided as is illustrated in FIG. 12 for the array structure because the voltage for comparison amplification is extremely small.

Figure 15:
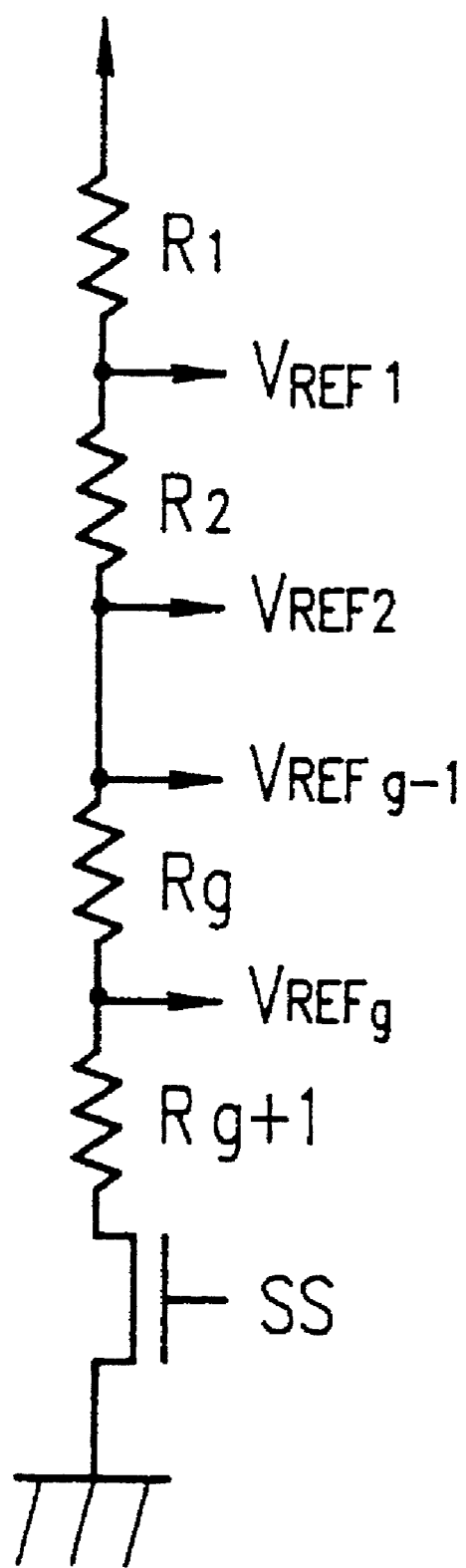
FIG. 15 is a diagram of a circuit for generating a reference potential in the nonvolatile semiconductor memory device shown in FIG. 14.
Figure 16:
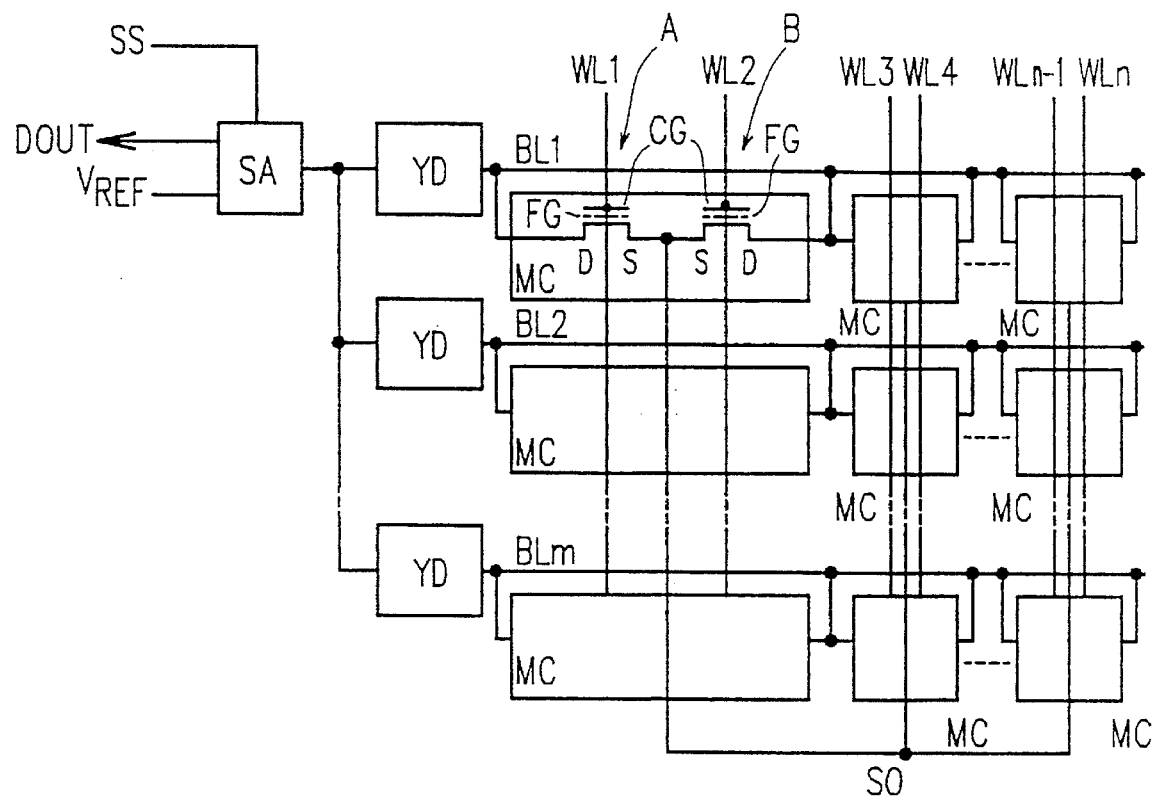
FIG. 16 is a block diagram of a conventional nonvolatile semiconductor memory device.

In the third example, a plurality of reference voltages (in this case, reference voltages in the number of g) are set using dummy memory cells. Such setting may also be performed by resistance division. FIG. 15 shows a circuit diagram for setting a plurality of reference voltages by resistance division. In FIG. 15, a plurality of resistances $R_1, R_2, \ldots, R_{g+1}$ having different resistance values are connected in series. A plurality of reference voltages $V_{REF1}, V_{REF2}, \ldots, V_{REFg}$ are set by resistance division.

In a nonvolatile semiconductor memory device according to the present invention, when the voltage on the control gate of the memory cell is changed, the level of the charge accumulated on the floating gate of the memory cell changes. Accordingly, the capacitance between the floating gate and the semiconductor substrate changes, which causes a change in the voltage on the bit line. The change in the voltage on the bit line corresponds to the capacitance between the floating gate and the channel region. The level of change in the voltage on the bit line and the reference voltage which is set internally are comparison-amplified for reading data. Due to such a structure, a source diffusion region of the transistor of the memory cell is not necessary, which reduces the area of the memory device.

Since the source diffusion region is not grounded or no source diffusion region is provided, there is no current flowing through the transistor of the memory cell for reading data. Accordingly, incorrect data reading is avoided even if the data in the memory cell is excessively erased.

By storing polynary data in the memory cell in the form of capacitances between the control gate and the channel region of the transistor and comparing the capacitances and voltages in the memory cell having different levels, polynary data in the memory cell can be read. In this manner, an area required for one datum is further reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device, comprising:

a semiconductor substrate;

an insulation layer located on the semiconductor substrate;

a plurality of memory cells arranged on the semiconductor substrate in a matrix with the insulation layer therebetween, the memory cells each including a floating gate located on the semiconductor substrate with the insulation layer therebetween, a control gate for forming a capacitance with the floating gate with the insulation layer interposed therebetween, an impurity diffusion region located in the semiconductor substrate and having an opposite conductivity to that of the semiconductor substrate, and a bit line connected to the impurity diffusion region;

application means for applying a control voltage for reading data from the memory cell to the control gate; and determination means for determining data to be read from a plurality of sets of data and outputting the data, wherein the determination means determines the data to be read, based on the difference in voltages on the bit line, the difference in the voltages on the bit line which voltage is caused by the difference in the capacitances between the floating gate and the semiconductor substrate, the difference in the capacitance being caused by the difference in charge levels in the floating gate when the control voltage is applied to the control gate.

2. A nonvolatile semiconductor memory device according to claim 1, wherein each memory cell includes a selection gate located on the drain diffusion region with the insulation layer therebetween.

3. A nonvolatile semiconductor memory device according to claim 1, further comprising reference potential output means for outputting a prescribed reference potential, wherein the determination means detects which one of the potential in the bit line and a prescribed reference potential is higher and determines the data to be read based on the detection result.

4. A nonvolatile semiconductor memory device according to claim 3, wherein each memory cell includes a selection gate located on the drain diffusion region with the insulation layer therebetween.

5. A nonvolatile semiconductor memory device according to claim 3, wherein the reference potential output means is a dummy cell having an identical structure with a structure of the memory cell and having a prescribed level of charge accumulated in the floating gate thereof.

6. A nonvolatile semiconductor memory device according to claim 5, wherein each memory cell includes a selection gate located on the drain diffusion region with the insulation layer therebetween.

7. A nonvolatile semiconductor memory device according to claim 1, further comprising reference potential output means for outputting a plurality of different prescribed reference potentials, wherein the floating gate stores a plurality of different levels of charges in accordance with written data, and the determination means detects whether each prescribed reference potential is higher than the corresponding charge and determines the data to be read based on the detection result.

8. A nonvolatile semiconductor memory device according to claim 7, wherein each memory cell includes a selection gate located on the drain diffusion region with the insulation layer therebetween.

9. A nonvolatile semiconductor memory device according to claim 7, wherein the reference potential output means is a plurality of dummy cells each having an identical structure with structure of the memory cell and respectively having a plurality of different prescribed levels of charges accumulated in the floating gate thereof.

10. A nonvolatile semiconductor memory device according to claim 9, wherein each memory cell includes a selection gate located on the drain diffusion region with the insulation layer therebetween.

* * * * *